United States Patent [19]

Noda et al.

[11] Patent Number: 5,767,573
[45] Date of Patent: Jun. 16, 1998

[54] SEMICONDUCTOR DEVICE

[75] Inventors: Sukehisa Noda; Akira Fujita, both of Tokyo; Naoki Yoshimatsu; Makoto Takehara, both of Fukuoka, all of Japan

[73] Assignee: Mitsubishi Denki Kabushiki Kaisha, Tokyo, Japan

[21] Appl. No.: 633,456

[22] Filed: Apr. 17, 1996

[30] Foreign Application Priority Data

Oct. 26, 1995 [JP] Japan .................................. 7-278903

[51] Int. Cl.⁶ ........................... H01L 23/495; H01L 23/34
[52] U.S. Cl. ........................ 257/675; 257/676; 257/692; 257/717; 257/725
[58] Field of Search ................................ 257/717, 724, 257/725, 675, 676, 691, 692, 796

[56] References Cited

U.S. PATENT DOCUMENTS

| | | | |
|---|---|---|---|
| 4,042,952 | 8/1977 | Kraybill | 257/724 |
| 4,766,481 | 8/1988 | Gobrecht et al. | 257/724 |
| 5,124,783 | 6/1992 | Sawaya | 257/783 |
| 5,172,215 | 12/1992 | Kobayashi et al. | 257/724 |
| 5,245,216 | 9/1993 | Sako | 257/724 |
| 5,291,065 | 3/1994 | Arai et al. | 257/724 |
| 5,475,263 | 12/1995 | Coady et al. | 257/717 |
| 5,488,256 | 1/1996 | Tsunoda | 257/724 |
| 5,552,637 | 9/1996 | Yamagata | 257/717 |
| 5,559,374 | 9/1996 | Ohta et al. | 257/717 |
| 5,585,672 | 12/1996 | Koike et al. | 257/724 |
| 5,606,487 | 2/1997 | Yasukawa et al. | 257/717 |
| 5,621,243 | 4/1997 | Baba et al. | 257/717 |

FOREIGN PATENT DOCUMENTS

| | | |
|---|---|---|
| 0 533 158 | 3/1993 | European Pat. Off. . |
| 0 548 497 | 6/1993 | European Pat. Off. . |
| 0 609 528 | 8/1994 | European Pat. Off. . |
| 38 37 618 | 5/1990 | Germany . |
| 39 31 634 | 4/1991 | Germany . |
| 40 40 691 | 6/1991 | Germany . |
| 40 17 697 | 12/1991 | Germany . |
| 38 14 469 | 12/1992 | Germany . |
| 195 09 411 | 9/1995 | Germany . |
| 663 491 | 12/1987 | Switzerland . |

OTHER PUBLICATIONS

Patent Abstracts of Japan, vol. 9, No. 189 (E–333), Aug. 6, 1985, JP 60–058646, Apr. 4, 1985.
Patent Abstracts of Japan, vol. 9, No. 328 (E–369), Dec. 24, 1985, JP 60–160154, Aug. 21, 1985.
Patent Abstracts of Japan, vol. 9, No. 056 (E–302), Mar. 12, 1985, JP 59–197158, Nov. 8, 1984.
Werner Bresch, Technische Rundschau, vol. 78, No. 45, pp. 106–108, Nov. 1986, "Hybride Leistungs–IC".
Electronique Radio Plans, No. 551, pp. 70–74, Oct. 1, 1993, "IGBT: Quelle Generation Choisir?" (with partial English translation).
C. Liu, et al., IBM Technical Disclosure Bulletin, vol. 16, No. 11, pp. 3826–3827, Apr. 1974, "Power Hybrid Module".

*Primary Examiner*—Tom Thomas
*Assistant Examiner*—David Ostrowski
*Attorney, Agent, or Firm*—Oblon, Spivak, McClelland, Maier & Neustadt, P.C.

[57] ABSTRACT

A semiconductor device is disclosed which employs transfer molding to simplify a resin sealing step, reduces fabrication costs without using expensive elements, and has an improved efficiency of dissipation of heat generated by a power device and an improved product rating. The power device (101) and a control device (102) are placed in predetermined positions on horizontally positioned lead frames (103a, 103b), respectively. An insulating layer (105) of epoxy resin or the like is formed on a major surface of a heat sink (104), and a circuit pattern layer (106) formed on a major surface of the insulating layer (105) is shaped to conform to a predetermined circuit pattern. The lead frames (103a, 103b) are disposed on the circuit pattern layer (106).

17 Claims, 9 Drawing Sheets

SEMICONDUCTOR DEVICE

BACKGROUND OF THE INVENTION

1. Field of the Invention

The present invention relates to a modular semiconductor device and, more particularly, to a semiconductor device having a power device and a control device formed on lead frames.

2. Description of the Background Art

Recently, intelligent power module type semiconductor devices (abbreviated as IPMs hereinafter) have been developed which are of modular construction containing a power device and a control device for controlling the power device.

Figure 12:
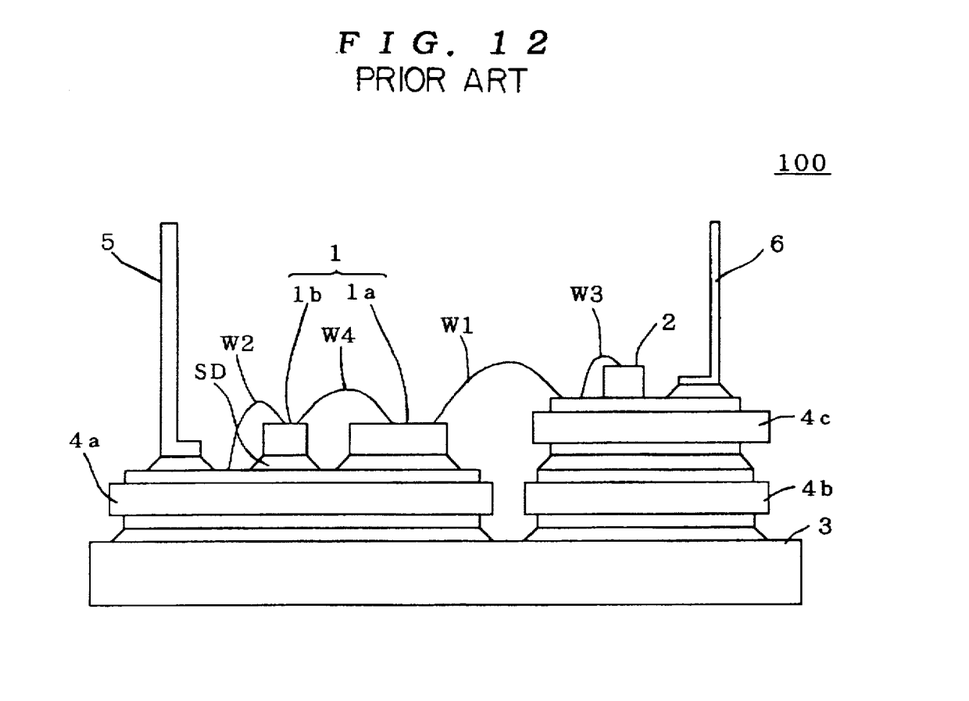
FIG. 12 is a cross-sectional view of a conventional semiconductor device.

FIG. 12 is a cross-sectional view of an IPM 100 which is an example of the conventional IPMs. Referring to FIG. 12, the IPM 100 comprises a metal heat sink 3 serving as a base for mounting a power device 1 and a control device 2 thereon and for dissipating heat generated by the power device 1 when energized to the exterior. DBC (direct bonding copper) substrates 4a and 4b are soldered onto a major surface of the heat sink 3. Solder is designated by SD in FIG. 12. The DBC substrates include a plate of alumina ceramics having opposite major surfaces to which copper foils are directly bonded by oxidation bond.

A predetermined circuit pattern is formed in the copper foil layer on a first major surface of the DBC substrate 4a to which the power device 1 and a main terminal 5 for establishing an electrical connection between the power device 1 and the exterior are bonded by soldering in accordance with the circuit pattern. The power device 1 comprises an IGBT (insulated gate bipolar transistor) 1a and a free wheeling diode 1b. The main terminal 5 is positioned to extend perpendicularly to the first major surface of the DBC substrate 4a.

A DBC substrate 4c is soldered onto a first major surface of the DBC substrate 4b. The control device 2 and a control terminal 6 for establishing an electrical connection between the control device 2 and the exterior are bonded onto a first major surface of the DBC substrate 4c by soldering. The control terminal 6 is positioned to extend perpendicularly to the first major surface of the DBC substrate 4c.

A control signal from the control device 2 is applied to the power device 1 through an aluminum interconnection wire W1. Input and output of the power device 1 are connected to the main terminal 5 through an aluminum interconnection wire W2. The control device 2 is electrically connected to the control terminal 6 through an aluminum interconnection wire W3. The aluminum interconnection wire W1 establishes an electrical connection between the power device 1 and the control device 2. An aluminum interconnection wire W4 establishes an electrical connection between the IGBT 1a and the free wheeling diode 1b.

In the IPM 100, as above described, the control device 2 is disposed over the DBC substrate 4b with the DBC substrate 4c therebetween. Such an arrangement is to reduce the influence of noises generated by the operation of the power device 1 upon the control device 2 when the rating of the power device 1 is greatly high. The DBC substrate 4c functions as a shield against electrical noises. The IPM 100 as a product has, for example, a rated output current of about 600 A and a rated withstand voltage of about 2000 V. The IPM 100 wherein the DBC substrate 4c overlying the DBC substrate 4b is used as a shield is referred as to a shield layer added type semiconductor device.

Figure 13:
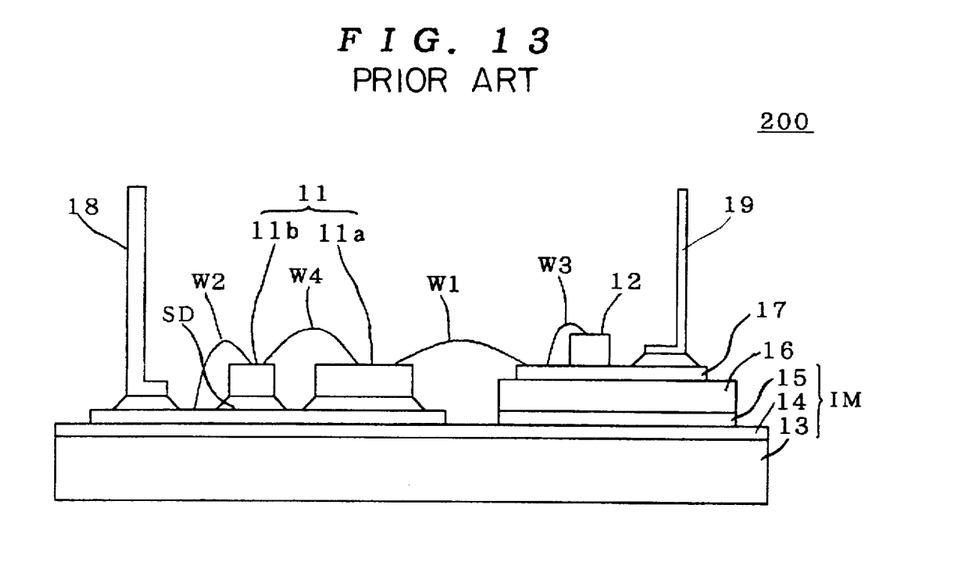
FIGS. 13 and 14 are cross-sectional views of another conventional semiconductor device.

FIG. 13 is a cross-sectional view of an IPM 200 having no DBC substrates which is an example of the conventional IPMs. Referring to FIG. 13, the IPM 200 comprises a metal heat sink 13 serving as a base for placing a power device 11 and a control device 12 thereon and for dissipating heat generated by the power device 11 when energized to the exterior. An insulating layer 14 made of epoxy resin or the like is formed on a major surface of the heat sink 13. A circuit pattern layer 15 shaped to conform to a predetermined circuit pattern is formed on a major surface of the insulating layer 14. The circuit pattern layer 15 is formed of, for example, copper and aluminum cladding foils and is bonded onto the major surface of the insulating layer 14 with a special adhesive (not shown). A plate-like body comprised of the heat sink 13, the insulating layer 14, and the circuit pattern layer 15 is referred to as an insulating metal substrate IM.

The power device 11 and a main terminal for establishing an electrical connection between the power device 11 and the exterior are bonded onto the circuit pattern layer 15 by soldering in accordance with the circuit pattern. Solder is designated by SD in FIG. 13. The power device 11 comprises an IGBT (insulated gate bipolar transistor) 11a and a free wheeling diode 11b. The main terminal 18 is positioned to extend perpendicularly to the major surface of the circuit pattern layer 15.

A glass cloth epoxy resin substrate 16 positioned in corresponding relation to the control device 12 is bonded onto the circuit pattern layer 15 with a special adhesive (not shown). The glass cloth epoxy resin substrate 16 includes an electrically conductive layer 17 shaped to conform to the circuit pattern of the circuit pattern layer 15 and formed on a major surface of the glass cloth epoxy resin substrate 16. The electrically conductive layer 17 is formed, for example, by heating and bonding a copper foil to the glass cloth epoxy resin substrate 16 under pressure during the fabrication of the glass cloth epoxy resin substrate 16.

The control device 12 and a control terminal 19 for establishing an electrical connection between the control device 12 and the exterior are bonded onto the electrically conductive layer 17 by soldering. The control terminal 19 is positioned to extend perpendicularly to the major surface of the electrically conductive layer 17. A control signal from the control device 12 is applied to the power device 11 through the aluminum interconnection wire W1. Input and output of the power device 11 are connected to the main terminal 18 through the aluminum interconnection wire W2. The control device 12 is electrically connected to the control terminal 19 through the aluminum interconnection wire W3. An aluminum interconnection wire W4 establishes an electrical connection between the IGBT 11a and the free wheeling diode 11b.

In the IPM 200, as above described, the control device 12 is disposed on the electrically conductive layer 17 of the glass cloth epoxy resin substrate 16, and the glass cloth epoxy resin substrate 16 is disposed on the insulating metal substrate IM. The insulating layer 14 and the circuit pattern layer 15 are in combination referred to as a first layer, and the glass cloth epoxy resin substrate 16 and the electrically conductive layer 17 are in combination referred to as a second layer. Then, the control device 12 is protected from electrical noises by the first and second layers.

Such an arrangement reduces the influence of the noises generated by the operation of the power device 11 upon the control device 12 when the rating of the power device 11 is relatively high. The IPM 200 as a product has, for example, a rated output current of about 75 A and a rated withstand voltage of about 1200 V. The IPM 200 which employs a dual-layer substrate comprised of the first and second layers is referred to as a dual-layer substrate type semiconductor device.

Figure 14:
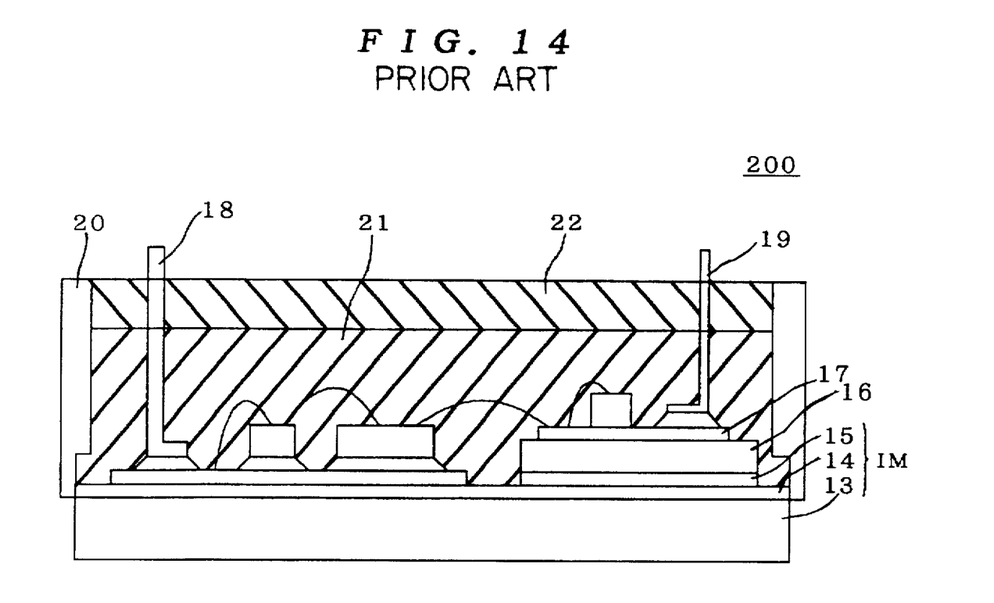

FIG. 14 is a cross-sectional view of the IPM 200 in the final form. Referring to FIG. 14, a resin case 20 surrounds the insulating metal substrate IM to form a box-shaped body having a bottom defined by the insulating metal substrate IM and side walls defined by the resin case 20. The box-shaped body is filled with a silicone gel 21 so that the power device 11 and the control device 12 are buried therein. A resin lid 22 made of, for example, epoxy resin is formed atop the silicone gel 21 to close the box-shaped body. The IPM 100 is similarly constructed such that the box-shaped body is formed using the resin case into which the silicone gel is introduced and the resin is hardened to close the box-shaped body.

This construction necessitates the separate formation of the resin case and the process step of mounting the resin case to the insulating metal substrate IM or the heat sink 13. Further, the insulating metal substrate IM and the dual-layer substrate are costly, causing the problem of the fabrication costs. To solve these problems, transfer molded type semiconductor devices which uses transfer molding for resin sealing without the expense of the resin case have recently been produced.

Figure 15:
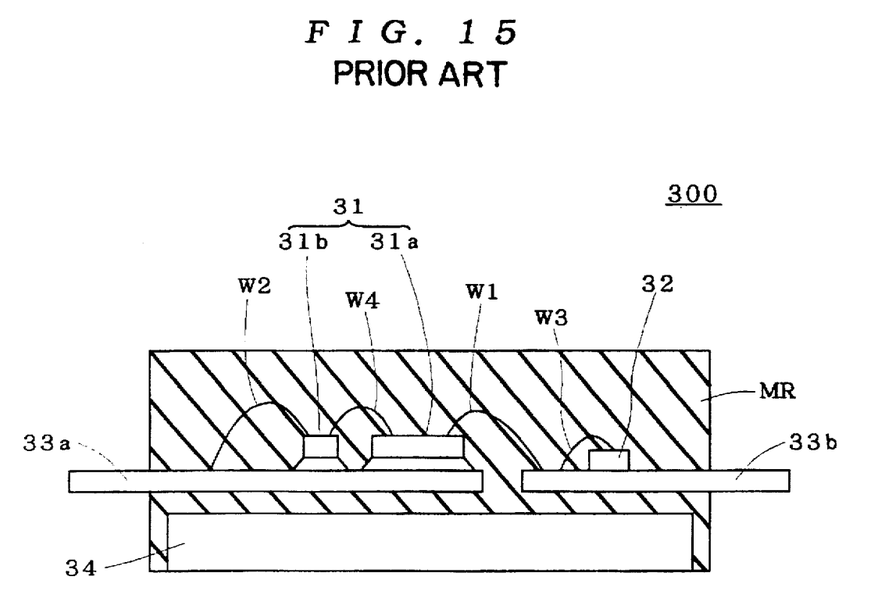
FIG. 15 is a cross-sectional view of still another conventional semiconductor device.

FIG. 15 is a cross-sectional view of an IPM 300, one of the conventional transfer molded type semiconductor devices. Referring to FIG. 15, a power device 31 and a control device 32 are placed in predetermined positions on horizontally positioned lead frames 33a and 33b, respectively. A control signal from the control device 32 is applied to the power device 31 through the aluminum interconnection wire W1. Input and output of the power device 31 are electrically connected to the lead frame 33a through the aluminum interconnection wire W2. The control device 32 is electrically connected to the lead frame 33b through the aluminum interconnection wire W3.

A metal heat sink 34 for dissipating heat generated by the power device 31 when energized to the exterior is formed under the lead frames 33a and 33b, with a molding resin MR therebetween. The heat sink 34, the lead frames 33a, 33b, and the power and control devices 31, 32 formed on the lead frames 33a, 33b are sealed in the molding resin MR. Positioning the power device 31 and control device 32 on the lead frames 33a and 33b in this fashion allows resin sealing by transfer molding.

In the IPM 300 sealed in resin by transfer molding, as above described, the heat generated by the power device 31 when energized is transferred to the heat sink 34 through the molding resin MR since the molding resin MR is present between the lead frame 33a and the heat sink 34. Thus, the IPM 300 dissipates heat less efficiently than the IPM 100 and IPM 200 and is incapable of meeting the requirement of the power devices having a high rating, such as the power devices 1 and 11. The IPM 300 as a product has, for example, a rated output current of about 30 A and a rated withstand voltage of about 1200 V.

As described hereinabove, the IPM 100 and IPM 200 must use the resin case for resin sealing, requiring the process step of mounting the resin case to the insulating metal substrate IM or heat sink 3. Further, the insulating metal substrate IM and the dual-layer substrate are costly (the cost of the dual-layer substrate is twice to three times that of the insulating metal substrate having the same area), resulting in the problem of high fabrication costs.

On the other hand, the IPM 300 which is sealed in resin by transfer molding requires more simple resin sealing step than the IPM 100 and IPM 200 and is less expensive because of the use of neither the insulating metal substrate nor the dual-layer substrate. However, the IPM 300 in which the heat generated by the power device 31 is transferred to the heat sink 34 through the molding resin MR dissipates heat less efficiently than the IPM 100 and IPM 200, making it difficult to increase the rating of the power device 31. For any increase in efficiency of heat dissipation, the molding resin MR between the lead frame 33a and heat sink 34 must be as thin and uniform as possible, which necessitates two molding operations, resulting in the problem of workability.

SUMMARY OF THE INVENTION

According to a first aspect of the present invention, a semiconductor device comprises: an insulating metal substrate; a lead frame formed on the insulating metal substrate and having first and second circuit portions; a power device formed on the first circuit portion of the lead frame; and a control device formed on the second circuit portion of the lead frame for controlling the power device, the insulating metal substrate including a heat sink for dissipating heat generated by the power device when the semiconductor device is in operation to the exterior, an insulating layer formed on an upper major surface of the heat sink, and a circuit pattern layer formed on the insulating layer and having first and second circuit patterns corresponding respectively to the first and second circuit portions, the first and second circuit portions of the lead frame being joined onto the first and second circuit patterns, respectively, the semiconductor device being sealed in resin by transfer molding so that a lower major surface of the heat sink is exposed.

According to a second aspect of the present invention, a semiconductor device comprises: an insulating base body; a lead frame formed on the insulating base body and having first and second circuit portions; a power device formed on the first circuit portion of the lead frame; a control device formed on the second circuit portion of the lead frame for controlling the power device; and a heat sink joined to a lower major surface of the insulating base body for dissipating heat generated by the power device when the semiconductor device is in operation to the exterior, the insulating base body including a thermally conductive, electrically insulating substrate, a circuit pattern layer formed on the electrically insulating substrate and having first and second circuit patterns corresponding respectively to the first and second circuit portions, and an electrically conductive layer formed on a lower major surface of the electrically insulating substrate and joined to an upper major surface of the heat sink, the first and second circuit portions of the lead frame being joined onto the first and second circuit patterns respectively, the semiconductor device being sealed in resin by transfer molding so that a lower major surface of the heat sink is exposed.

According to a third aspect of the present invention, a semiconductor device comprises: an insulating base body; a lead frame formed on the insulating base body and having first and second circuit portions; a power device formed on the first circuit portion of the lead frame; and a control device formed on the second circuit portion of the lead frame for controlling the power device, the insulating base body including a thermally conductive, electrically insulating substrate, a circuit pattern layer formed on the electrically insulating substrate and having first and second circuit patterns corresponding respectively to the first and second circuit portions, and an electrically conductive layer formed on a lower major surface of the electrically insulating substrate, the first and second circuit portions of the lead frame being joined onto the first and second circuit patterns respectively, the semiconductor device being sealed in resin by transfer molding so that a lower major surface of the electrically conductive layer is exposed.

Preferably, according to a fourth aspect of the present invention, the second circuit portion and the second circuit pattern are joined together by an insulative adhesive.

According to a fifth aspect of the present invention, a semiconductor device comprises: an insulating metal substrate; a lead frame formed on the insulating metal substrate and having a predetermined circuit portion; a power device formed on the insulating metal substrate; and a control device formed on the circuit portion of the lead frame for controlling the power device, the lead frame further including a lead connected to the power device, the insulating metal substrate including a heat sink for dissipating heat generated by the power device during operation to the exterior, an insulating layer formed on the heat sink, and a circuit pattern layer formed on the insulating layer and having a first circuit pattern directly joined to the power device and a second circuit pattern corresponding to the predetermined circuit portion of the lead frame, the predetermined circuit portion of the lead frame being joined onto the second circuit pattern, the lead being joined to the first circuit pattern, the semiconductor device being sealed in resin by transfer molding so that a lower major surface of the heat sink is exposed.

According to a sixth aspect of the present invention, a semiconductor device comprises: an insulating base body; a lead frame formed on the insulating base body and having a predetermined circuit portion; a power device formed on the insulating base body; a control device formed on the circuit portion of the lead frame for controlling the power device; and a heat sink joined to a lower major surface of the insulating base body for dissipating heat generated by the power device when the semiconductor device is in operation to the exterior, the lead frame further including a lead connected to the power device, the insulating base body including a thermally conductive, electrically insulating substrate, a circuit pattern layer formed on the electrically insulating substrate and having a first circuit pattern directly joined to the power device and a second circuit pattern corresponding to the predetermined circuit portion of the lead frame, and an electrically conductive layer formed on a lower major surface of the electrically insulating substrate and joined to an upper major surface of the heat sink, the predetermined circuit portion of the lead frame being joined onto the second circuit pattern, the lead being joined to the first circuit pattern, the semiconductor device being sealed in resin by transfer molding so that a lower major surface of the heat sink is exposed.

According to a seventh aspect of the present invention, a semiconductor device comprises: an insulating base body; a lead frame formed on the insulating base body and having a predetermined circuit portion; a power device formed on the insulating base body; and a control device formed on the circuit portion of the lead frame for controlling the power device, the lead frame further including a lead connected to the power device, the insulating base body including a thermally conductive, electrically insulating substrate, a circuit pattern layer formed on the electrically insulating substrate and having a first circuit pattern directly joined to the power device and a second circuit pattern corresponding to the predetermined circuit portion of the lead frame, and an electrically conductive layer formed on a lower major surface of the electrically insulating substrate, the predetermined circuit portion of the lead frame being joined onto the second circuit pattern, the lead being joined to the first circuit pattern, the semiconductor device being sealed in resin by transfer molding so that a lower major surface of the electrically conductive layer is exposed.

Preferably, according to an eighth aspect of the present invention, the circuit portion and the second circuit pattern are joined together by an insulative adhesive.

Preferably, according to a ninth aspect of the present invention, the power device is joined to either the insulating metal substrate or the insulating base body so that an upper major surface of the power device is substantially levelled with upper major surfaces of the lead and the circuit portion.

In the semiconductor device of the first aspect of the present invention, the heat generated by the power device when the semiconductor device is in operation is transferred to the heat sink through the lead frame, circuit pattern layer, and insulating layer. This achieves improvements in efficiency of heat dissipation over the structure including the molding resin between the lead frame and the heat sink, increasing the rating of the power device. The use of the lead frame allows the transfer molding to be performed to simplify the fabrication steps and reduce the number of elements, reducing the fabrication costs.

In the semiconductor device of the second aspect of the present invention, the heat generated by the power device when the semiconductor device is in operation is transferred to the heat sink through the insulating base body having the highly thermally conductive, electrically insulating substrate. This achieves further improvements in efficiency of heat dissipation, further increasing the rating of the power device. The use of the lead frame allows the transfer molding to be performed to simplify the fabrication steps and reduce the number of elements, reducing the fabrication costs.

In the semiconductor device of the third aspect of the present invention, the heat generated by the power device when the semiconductor device is in operation is transferred to the heat sink through the insulating base body having the highly thermally conductive, electrically insulating substrate. This achieves further improvements in efficiency of heat dissipation, further increasing the rating of the power device. The use of the lead frame allows the transfer molding to be performed to simplify the fabrication steps and reduce the number of elements, reducing the fabrication costs. The heat sink may be dispensed with to reduce the fabrication costs.

In the semiconductor device of the fourth aspect of the present invention, the second circuit portion of the lead frame which is bonded to the second circuit pattern with the insulative adhesive is electrically insulated from the second circuit pattern which in turn functions as a shield against electrical noises. Thus, the control device mounted on the second circuit portion is protected from the electrical noises. The insulative adhesive is less expensive than other insulating means to contribute to the reduction in fabrication costs.

In the semiconductor device of the fifth aspect of the present invention, the heat generated by the power device when the semiconductor device is in operation is directly transferred to the circuit pattern layer of the insulating metal substrate, not through the lead frame. This achieves improvements in efficiency of heat dissipation over the structure wherein the heat is transferred through the lead frame, increasing the rating of the power device. The use of the lead frame allows the transfer molding to be performed to simplify the fabrication steps and reduce the number of elements, reducing the fabrication costs.

In the semiconductor device of the sixth aspect of the present invention, the heat generated by the power device when the semiconductor device is in operation is directly transferred to the circuit pattern layer of the insulating base body, not through the lead frame. This achieves improvements in efficiency of heat dissipation over the structure wherein the heat is transferred through the lead frame, increasing the rating of the power device. The use of the lead frame allows the transfer molding to be performed to simplify the fabrication steps and reduce the number of elements, reducing the fabrication costs.

In the semiconductor device of the seventh aspect of the present invention, the heat generated by the power device when the semiconductor device is in operation is directly transferred to the circuit pattern layer of the insulating base body, not through the lead frame. This achieves improvements in efficiency of heat dissipation over the structure wherein the heat is transferred through the lead frame. The use of the lead frame allows the transfer molding to be performed to simplify the fabrication steps and reduce the number of elements, reducing the fabrication costs. The need for the heat sink is eliminated to reduce the fabrication costs.

In the semiconductor device of the eighth aspect of the present invention, the circuit portion of the lead frame which is bonded to the second circuit pattern of the circuit pattern layer with the insulative adhesive is electrically insulated from the second circuit pattern which in turn functions as a shield against electrical noises. Thus, the control device mounted on the circuit portion is protected from the electrical noises. Further, the insulative adhesive is less expensive than other insulating means to contribute to the reduction in fabrication costs.

In the semiconductor device of the ninth aspect of the present invention, the upper major surface of the power device is substantially levelled with the upper major surfaces of the lead and circuit portion of the lead frame. This decreases the height of the interconnection wires extending between the power device and the lead and circuit portion of the lead frame, reducing the fabrication costs. Resin sealing by transfer molding which involves the injection of resin at a high pressure into the mold might cause the resin to force the interconnection wires, if large in height, to fall down, resulting in contacts between the interconnection wires and between the adjacent lead and interconnection wire, producing rejects. The decrease in height of the interconnection wires solves the problem and improves a fabrication yield.

It is therefore an object of the present invention to provide a semiconductor device which requires a simple resin sealing process step by the use of transfer molding and a reduced fabrication cost without using costly components, with increased efficiency of dissipation of heat generated by a power device and with an improved product rating.

These and other objects, features, aspects and advantages of the present invention will become more apparent from the following detailed description of the present invention when taken in conjunction with the accompanying drawings.

DESCRIPTION OF THE PREFERRED EMBODIMENTS

<A. First Preferred Embodiment>

<A-1. Device Construction>

Figure 1:
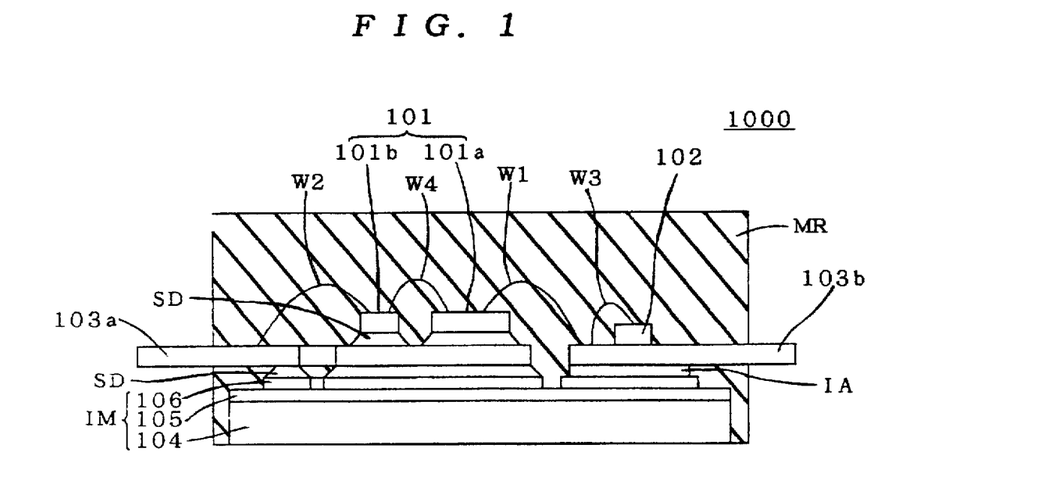
FIG. 1 is a cross-sectional view of a semiconductor device according to a first preferred embodiment of the present invention.
Figure 2:
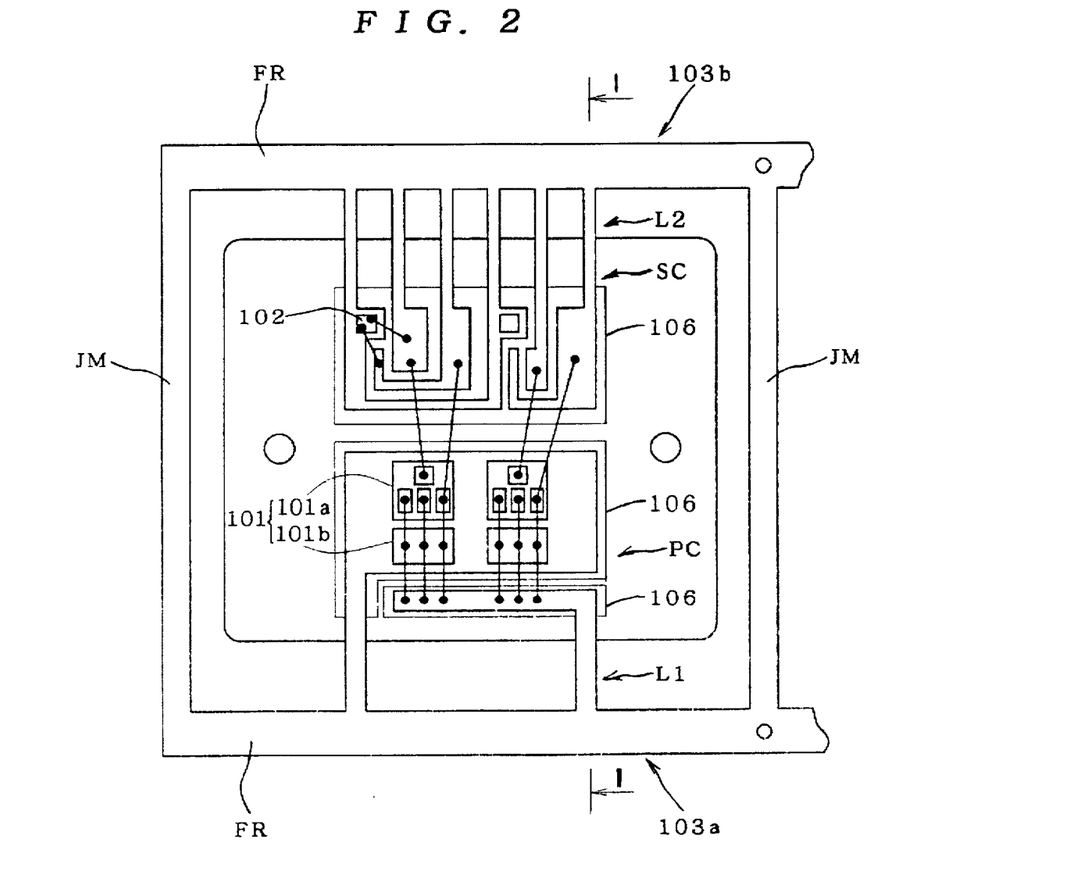
FIG. 2 is a plan view of the semiconductor device according to the first preferred embodiment of the present invention.

Referring to FIGS. 1 and 2, the construction of an IPM 1000 which is a semiconductor device according to a first preferred embodiment of the present invention will now be described.

With reference to FIG. 1, a power device 101 and a control device 102 are placed in predetermined positions on horizontally positioned lead frames 103a and 103b, respectively. The IPM 1000 comprises a metal heat sink 104 serving as a base for placing the lead frames 103a and 103b thereon and for dissipating heat generated by the power device 101 when energized to the exterior.

An insulating layer 105 made of, for example, epoxy resin is formed on a major surface of the heat sink 104. The insulating layer 105 contains a low proportion of resin to increase the thermal conductivity thereof. As an example, the insulating layer 105 comprises 80% by weight of filler components.

Formed on a major surface of the insulating layer 105 is a circuit pattern layer 106 shaped to conform to a predetermined circuit pattern for functioning as a shield against electrical noises as well as functioning as a circuit pattern.

The circuit pattern layer 106 is formed of, for example, copper and aluminum cladding foils and is bonded onto the major surface of the insulating layer 105 with a special adhesive (not shown). A plate-shaped body comprised of the heat sink 104, the insulating layer 105, and the circuit pattern layer 106 is referred to as an insulating metal substrate IM.

The lead frame 103a is soldered onto the circuit pattern layer 106 in accordance with the circuit pattern. A solder layer is designated by SD in FIG. 1. The power device 101 is soldered onto the lead frame 103a. The power device 101 comprises an IGBT 101a and a free wheeling diode 101b.

An insulative adhesive IA is applied to an upper surface of the circuit pattern layer 106 in accordance with the circuit pattern to bond the lead frame 103b onto the circuit pattern layer 106. The insulative adhesive IA includes a silicone-based adhesive or an epoxy-based adhesive.

The control device 102 is soldered onto the lead frame 103b (although the solder layer is not shown). A control signal from the control device 102 is applied to the power device 101 through an aluminum interconnection wire W1 provided by means of wire bonding. Input and output of the power device 101 are electrically connected to the lead frame 103a through an aluminum interconnection wire W2. The control device 102 is electrically connected to the lead frame 103b through an aluminum interconnection wire W3. An aluminum interconnection wire W4 establishes an electrical connection between the IGBT 101a and the free wheeling diode 101b.

As illustrated in FIG. 1, the IPM 1000 is sealed in molding resin MR except a lower surface of the heat sink 104 (the surface of the heat sink 104 opposite from the lead frames) and part of the lead frames 103a and 103b which are to function as external leads after the molding process.

FIG. 2 is a plan view of the IPM 1000. FIG. 1 is a cross-sectional view taken in the direction of the arrows A—A of FIG. 2. For the purpose of simplification, the molding resin MR is not shown in FIG. 2.

Referring to FIG. 2, the lead frame 103a includes a power device circuit pattern PC, and a frame FR connected to a group of leads L1 extending from the power device circuit pattern PC. The lead frame 103b includes a control device circuit pattern SC, and a frame FR connected to a group of leads L2 extending from the control device circuit pattern SC. The structure of FIG. 2 is parts of the lead frame, and the lead frame has a plurality of similar structures in practice.

The circuit pattern layer 106 includes a pair of separate parts: a part joined to the power device circuit pattern PC and a part joined to the control device circuit pattern SC. When the circuit pattern layer 106 is used as the shield against electrical noises, the part joined to the control device circuit pattern SC is connected to the ground potential.

The two frames FR are arranged in parallel and connected together by two junction elements JM. The lead groups L1 and L2 extending from the power device circuit pattern PC and control device circuit pattern SC and the junction elements JM are formed integrally with the frames FR. Through holes formed in right and left end parts of the insulating metal substrate IM are provided to join the IPM 1000 to an external heat sink or the like with screws when the IPM 1000 is used. The same is true for other preferred embodiments.

Bonding the lead frames 103a and 103b having such arrangements onto the circuit pattern layer 106 allows resin sealing by transfer molding.

<A-2. Characteristic Function and Effect>

According to the first preferred embodiment of the present invention as above discussed, bonding the lead frames 103a and 103b to the insulating metal substrate IM permits the heat generated by the power device 101 during operation to be transferred to the heat sink 104 through the solder layer SD, the circuit pattern layer 106 formed of copper and aluminum cladding foils, and the insulating layer 105 of high thermal conductivity, achieving improvements in efficiency of heat dissipation over the IPM 300 including the molding resin between the lead frames and heat sink. This increases the rating of the power device 101. For example, the IPM 1000 as a product may have a rated output current of about 75 A and a rated withstand voltage of about 1200 V.

The insulative adhesive IA is used to bond the lead frame 103b to the circuit pattern layer 106. This electrically insulates the lead frame 103b from the circuit pattern layer 106 which in turn functions as the shield against electrical noises. Thus, the control device 102 disposed on the lead frame 103b is protected from the electrical noises. Although the IPM 100 and IPM 200 which are represented as the conventional semiconductor devices are also constructed to protect the control device from electrical noises, the IPM 1000 according to the present invention uses the less expensive insulative adhesive to achieve lower fabrication costs than the IPM 100 which uses the DBC substrate 4c for electrical insulation and the IPM 200 which uses the second layer comprised of the glass cloth epoxy resin substrate 16 and the electrically conductive layer 17 for electrical insulation.

Bonding the lead frames 103a and 103b onto the circuit pattern layer 106 allows resin sealing by transfer molding. Additionally, the absence of the molding resin between the lead frames and the heat sink eliminates the need to perform two separate transfer molding processes of the IPM 300 which is the conventional semiconductor device but requires only one transfer molding process.

<A-3. First Modification of First Preferred Embodiment>

In the first preferred embodiment of the semiconductor device according to the present invention, the lead frame 103b is bonded to the circuit pattern layer 106 by using the insulative adhesive IA. However, if there is no need to protect the control device 102 disposed on the lead frame 103b from electrical noises, solder may be used in place of the insulative adhesive IA to bond the lead frame 103b to the circuit pattern layer 106. In this modification, the solder layer SD must be shaped to conform to the circuit pattern configuration to prevent electrical conduction between the individual circuit patterns through the solder.

<A-4. Second Modification of First Preferred Embodiment>

The first preferred embodiment of the semiconductor device according to the present invention as above described is intended for improvements in product rating of the IPM 300 which is the conventional semiconductor device. A second modification of the first preferred embodiment shown in FIG. 3 is made in terms of reduction in fabrication costs by reducing the number of elements of the IPM 300.

Figure 3:
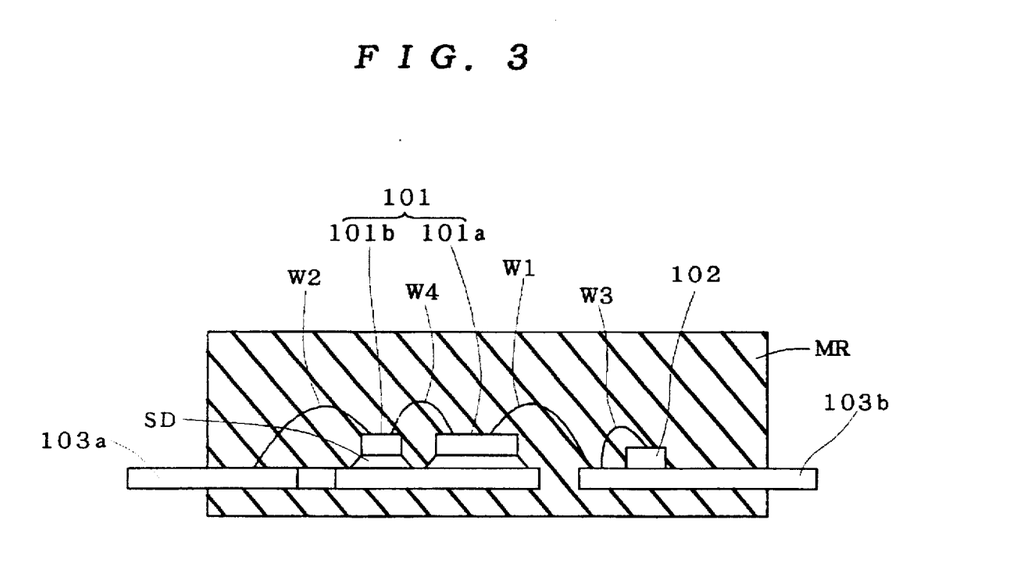
FIG. 3 is a cross-sectional view of a modification of the semiconductor device according to the first preferred embodiment of the present invention.

With reference to FIG. 3, the power device 101 and the control device 102 are placed in predetermined positions on the horizontally positioned lead frames 103a and 103b, respectively. A control signal from the control device 102 is applied to the power device 101 through the aluminum interconnection wire W1. Input and output of the power device 101 are electrically connected to the lead frame 103a through the aluminum interconnection wire W2. The control device 102 is electrically connected to the lead frame 103b through the aluminum interconnection wire W3. The IPM of FIG. 3 is sealed in the molding resin MR except the parts of the lead frames 103a and 103b which are to serve as external leads after the molding process.

Such an arrangement obviates the need for the heat sink 104, the insulating layer 105, and the circuit pattern layer 106, reducing the fabrication costs. When the IPM of FIG. 3 is used, the lower surface of the molding resin MR (the surface of the molding resin MR opposite from the lead frames) is joined to an external heat sink to dissipate heat.

<B. Second Preferred Embodiment>

<B-1. Device Construction>

Figure 4:
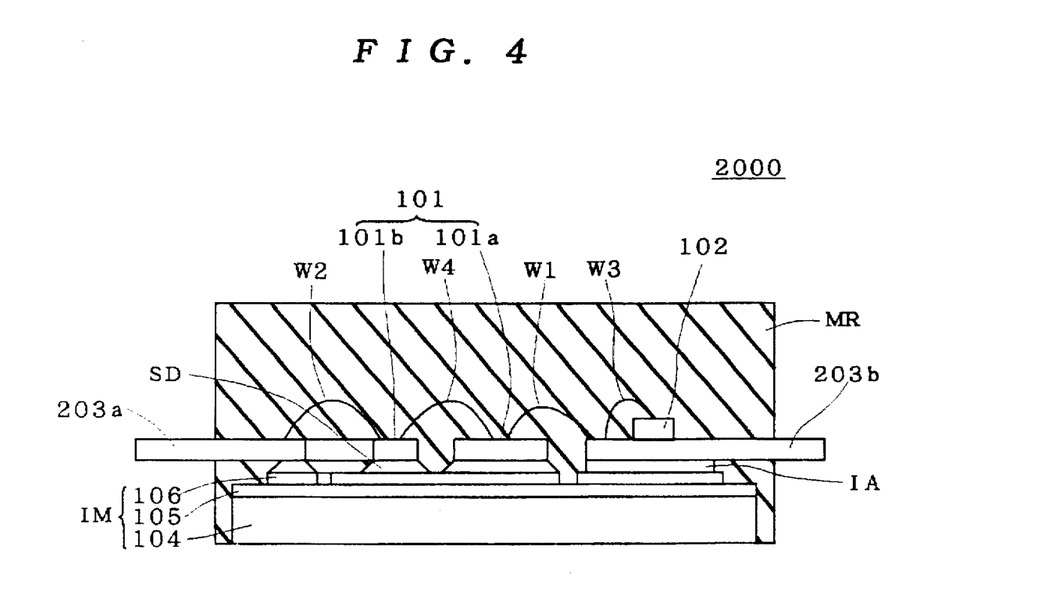
FIG. 4 is a cross-sectional view of the semiconductor device according to a second preferred embodiment of the present invention.
Figure 5:
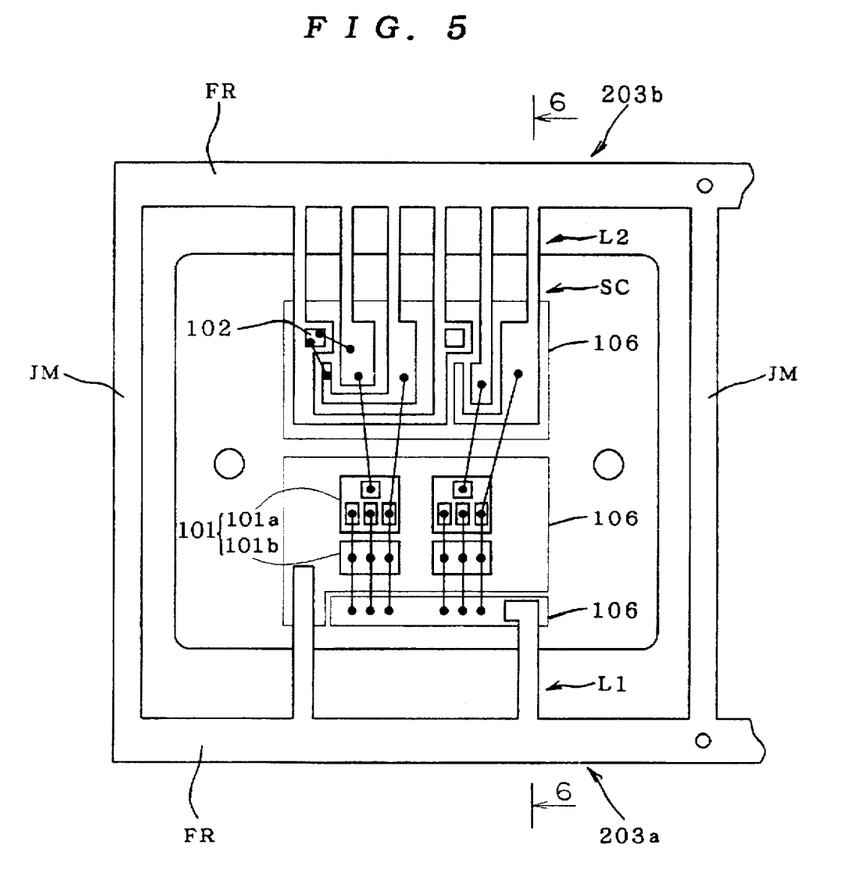
FIG. 5 is a plan view of the semiconductor device according to the second preferred embodiment of the present invention.

Referring to FIGS. 4 and 5, the construction of an IPM 2000 which is the semiconductor device according to a second preferred embodiment of the present invention will be described.

With reference to FIG. 4, a lead frame 203a is bonded onto the circuit pattern layer 106 by soldering in accordance with the circuit pattern. The solder layer is designated by SD in FIG. 4. The power device 101 is directly soldered onto the circuit pattern layer 106. The insulative adhesive IA is applied to the upper surface of the circuit pattern layer 106 in accordance with the circuit pattern to bond a lead frame 203b onto the circuit pattern layer 106. Like reference numerals and characters are used to designate elements identical with those of the IPM 1000 shown in FIG. 1, and the redundant description is dispensed with.

FIG. 5 is a plan view of the IPM 2000. FIG. 4 is a cross-sectional view taken in the direction of the arrows A—A of FIG. 5. For the purpose of simplification, the molding resin MR is not shown in FIG. 5.

Referring to FIG. 5, the lead frame 203a does not include the power device circuit pattern PC, and the lead group L1 extending from the frame FR is connected to the upper surface of the circuit pattern layer 106.

<B-2. Characteristic Function and Effect>

According to the second preferred embodiment of the present invention as above described, directly bonding the power device 101 onto the circuit pattern layer 106 permits the heat generated by the power device 101 during operation to be directly transferred to the circuit pattern layer 106, not through the lead frame 203a, achieving improvements in efficiency of heat dissipation over the IPM 1000 wherein the heat is transferred through the lead frame 203a.

The major surface of the power device 101 may be substantially levelled with the major surfaces of the lead frames 203a and 203b to reduce the height of the aluminum interconnection wires extending from the power device 101 to the lead frames 203a and 203b, reducing the fabrication costs.

Further, the resin sealing by transfer molding involves injection of resin at a high pressure into the mold. Then, the increased height of the aluminum interconnection wires might cause resin to force the aluminum interconnection wires to fall down, resulting in contacts between the aluminum interconnection wires and between the adjacent lead and aluminum interconnection wire, producing rejects. The decreased height of the aluminum interconnection wires solves the problem and improves a fabrication yield.

<B-3. Modification of Second Preferred Embodiment>

In the second preferred embodiment according to the present invention as above discussed, the lead frame 203b is bonded to the circuit pattern layer 106 by using the insulative adhesive IA. However, if there is no need to protect the control device 102 disposed on the lead frame 203b from electrical noises, solder may be used in place of the insulative adhesive IA to bond the lead frame 203b to the circuit pattern layer 106. In this modification, the solder layer SD must be shaped to conform to the circuit pattern configuration to prevent the electrical conduction between the individual circuit patterns through the solder.

<C. Third Preferred Embodiment>

<C-1. Device Construction>

Figure 6:
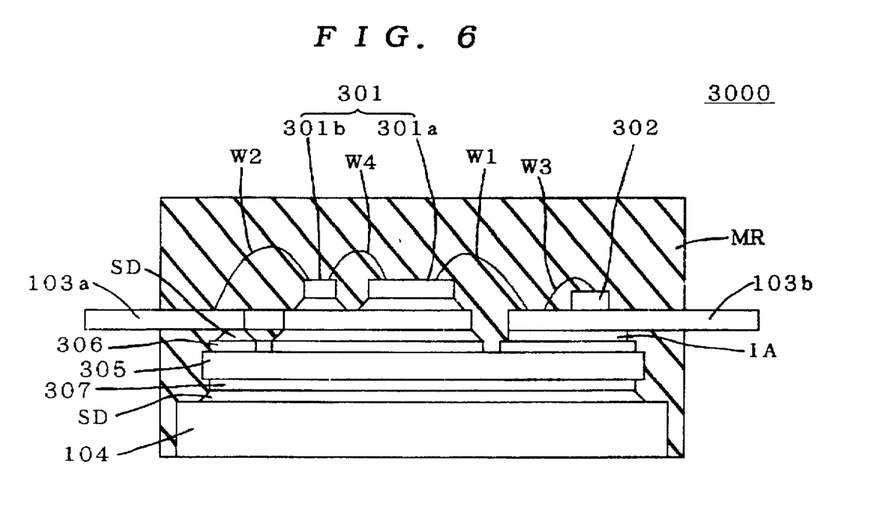
FIG. 6 is a cross-sectional view of the semiconductor device according to a third preferred embodiment of the present invention.
Figure 7:
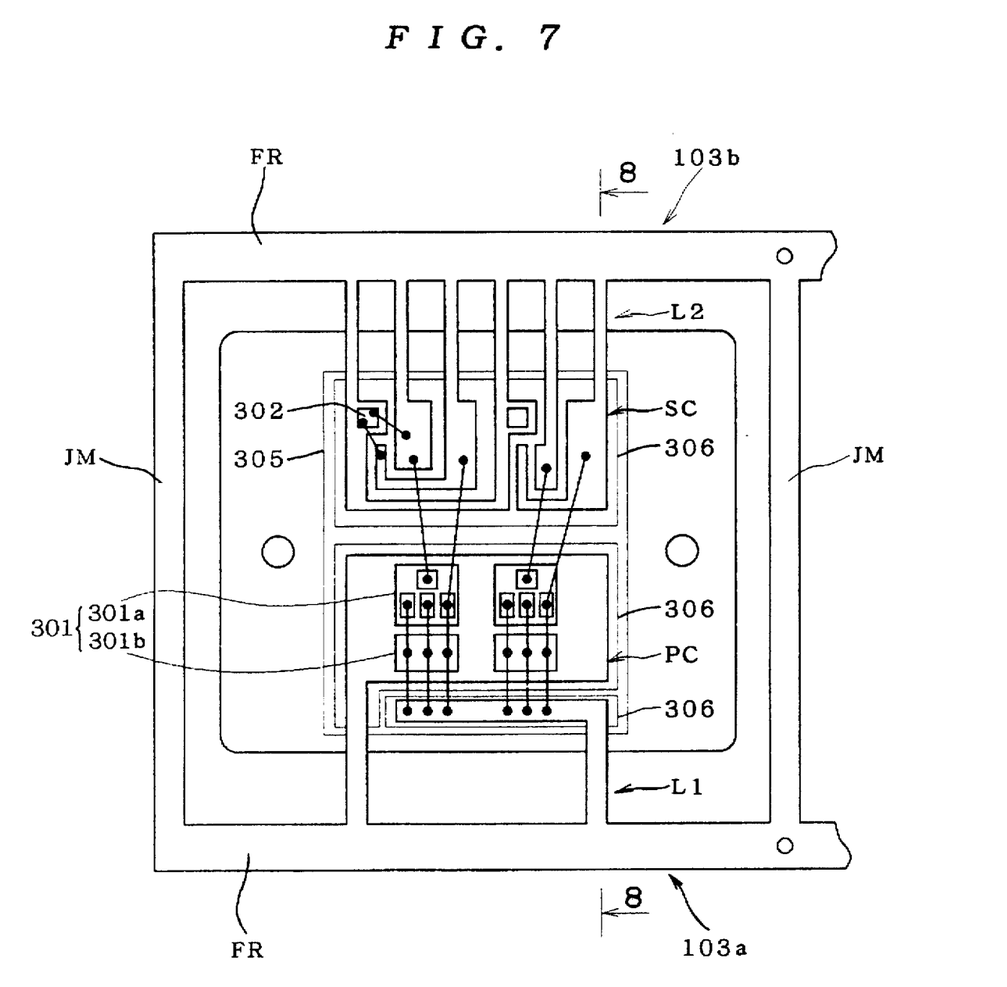
FIG. 7 is a plan view of the semiconductor device according to the third preferred embodiment of the present invention.

Referring to FIGS. 6 and 7, the construction of an IPM 3000 which is the semiconductor device according to a third preferred embodiment of the present invention will be described.

With reference to FIG. 6, a power device 301 and a control device 302 are placed in predetermined positions on the horizontally positioned lead frames 103a and 103b, respectively. The IPM 3000 comprises the metal heat sink 104 serving as a base for placing the lead frames 103a and 103b thereon and for dissipating heat generated by the power device 301 when energized to the exterior.

A DBC (direct bonding copper) substrate 305 is bonded on the major surface of the heat sink 104 by soldering. The solder layer is designated by SD in FIG. 6. The DBC substrate includes an alumina ceramics ($Al_2O_3$) plate having opposite major surfaces to which copper foils are directly bonded by oxidation bond. The alumina ceramics plate may be replaced with an aluminum nitride (AlN) plate. However, when the aluminum nitride plate is used, copper foils are bonded to the aluminum nitride plate with an adhesive.

The copper foil layer on a first major surface of the DBC substrate 305 has a predetermined circuit pattern to form a circuit pattern layer 306. The copper foil layer on a second major surface of the DBC substrate 305 acts as an electrically conductive layer 307 for ease of soldering to the heat sink 104.

The lead frames 103a and 103b are bonded to the circuit pattern layer 306 of the DBC substrate 305 in accordance with the circuit pattern. The lead frame 103a is bonded to the circuit pattern layer 306 by soldering. The solder layer is designated by SD in FIG. 6. The power device 301 is soldered onto the lead frame 103a. The power device 301 comprises an IGBT 301a and a free wheeling diode 301b. The electrically conductive layer 307 of the DBC substrate 305 is soldered to the heat sink 104.

The lead frame 103b is bonded to the circuit pattern layer 306 with the insulative adhesive IA. The control device 302 is bonded onto the lead frame 103b by soldering (although the solder layer is not shown). A control signal from the control device 302 is applied to the power device 301 through the aluminum interconnection wire W1 provided by means of wire bonding. Input and output of the power device 301 are electrically connected to the lead frame 103a through the aluminum interconnection wire W2. The control device 302 is electrically connected to the lead frame 103b through the aluminum interconnection wire W3. The aluminum interconnection wire W4 establishes an electrical connection between the IGBT 301a and the free wheeling diode 301b. Like reference numerals and characters are used to designate elements identical with those of the IPM 1000 shown in FIG. 1, and the redundant description is dispensed with.

FIG. 7 is a plan view of the IPM 3000. FIG. 6 is a cross-sectional view taken in the direction of the arrows A—A of FIG. 7. For the purpose of simplification, the molding resin MR is not shown in FIG. 7.

The power device circuit pattern PC and control device circuit pattern SC of the lead frames 103a and 103b are arranged to conform to the circuit pattern layer 306 on the DBC substrate 305 as shown in FIG. 7.

The circuit pattern layer 306 includes a pair of separate parts: a part joined to the power device circuit pattern PC, and a part joined to the control device circuit pattern SC. When the circuit pattern layer 306 is used as the shield against electrical noises, the part joined to the control device circuit pattern SC is connected to the ground potential.

<C-2. Characteristic Function and Effect>

According to the third preferred embodiment of the present invention as above discussed, bonding the lead frames 103a and 103b onto the DBC substrate 305 permits the heat generated by the power device 301 during operation to be transferred to the heat sink 104 through the solder layer SD and the DBC substrate 305. The alumina ceramics ($Al_2O_3$) plate or aluminum nitride (AlN) plate forming the DBC substrate 305 has a better thermal conductivity than epoxy resin, achieving improvements in efficiency of heat dissipation over the IPM 1000 and IPM 2000 comprising the insulating layer 105 of epoxy resin formed on the heat sink 104. This increases the rating of the power device 301. For example, the IPM 3000 as a product may have a rated output current of about 600 A and a rated withstand voltage of about 2000 V. Exemplary data of thermal conductivities in a unit of W/(m·K) have been obtained wherein the thermal conductivities of alumina ceramics and aluminum nitride are 21 and 130 respectively while the thermal conductivity of epoxy resin is 3.

<C-3. First Modification of Third Preferred Embodiment>

In the third preferred embodiment of the semiconductor device according to the present invention as above described, the lead frame 103b is bonded to the circuit pattern layer 306 by using the insulative adhesive IA. However, if there is no need to protect the control device 302 disposed on the lead frame 103b from electrical noises, solder may be used in place of the insulative adhesive IA to bond the lead frame 103b to the circuit pattern layer 306. In this modification, the solder layer SD must be shaped to conform to the circuit pattern configuration to prevent the electrical conduction between the individual circuit patterns through the solder.

<C-4. Second Modification of Third Preferred Embodiment>

In the third preferred embodiment of the present invention, the DBC substrate 305 is placed on the heat sink 104 serving as the base therefor. The DBC substrate 305, however, may be used as the base without using the heat sink 104.

Figure 8:
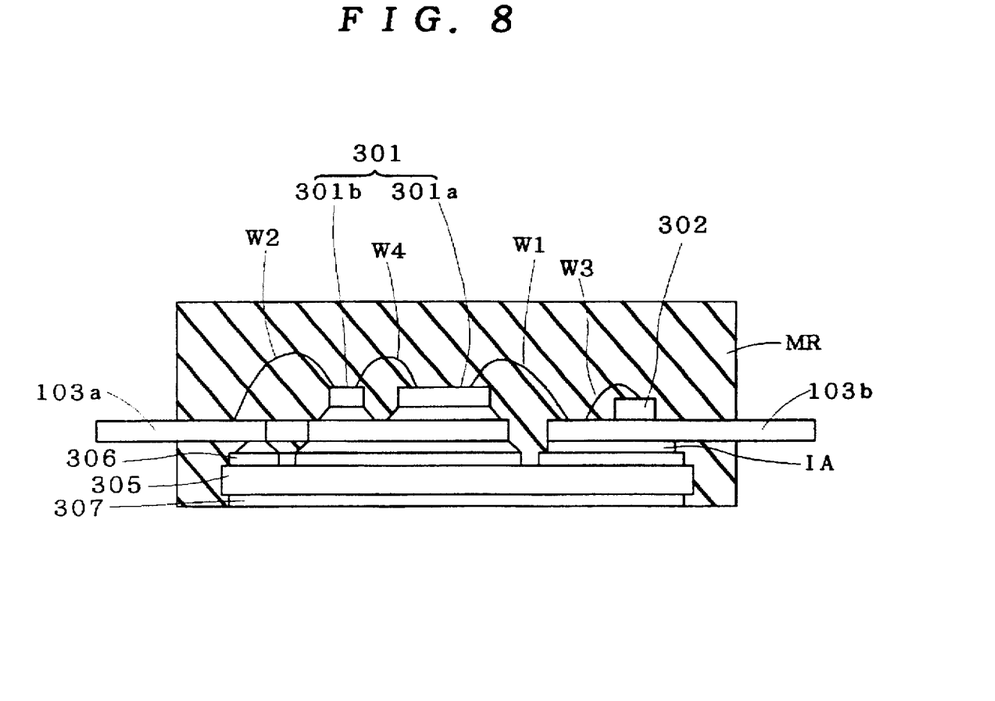
FIG. 8 is a cross-sectional view of a modification of the semiconductor device according to the third preferred embodiment of the present invention.

FIG. 8 illustrates a second modification of the third preferred embodiment. Referring to FIG. 8, the lower surface of the DBC substrate 305 (the surface of the DBC substrate 305 opposite from the lead frames) is not covered with the molding resin MR, but the electrically conductive layer 307 of the DBC substrate 305 is exposed.

Such an arrangement obviates the need for the heat sink 104 to reduce the fabrication costs. When the IPM is used, the electrically conductive layer 307 of the DBC substrate 305 is joined to an external heat sink not shown to dissipate heat.

<D. Fourth Preferred Embodiment>

<D-1. Device Construction>

Figure 9:
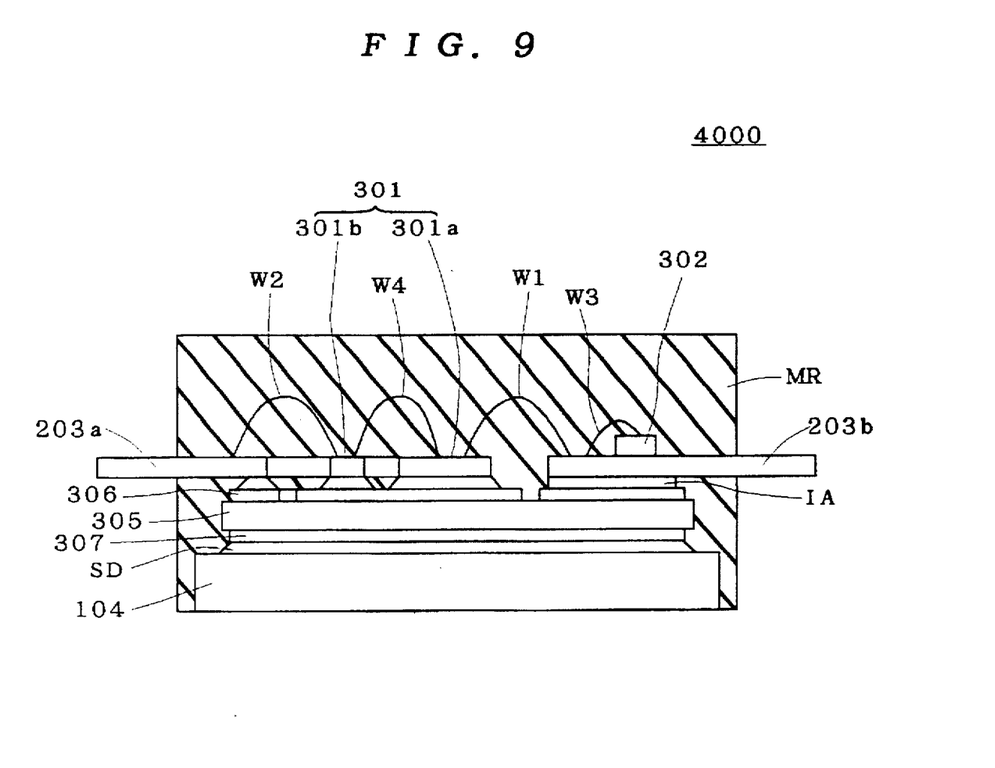
FIG. 9 is a cross-sectional view of the semiconductor device according to a fourth preferred embodiment of the present invention.
Figure 10:
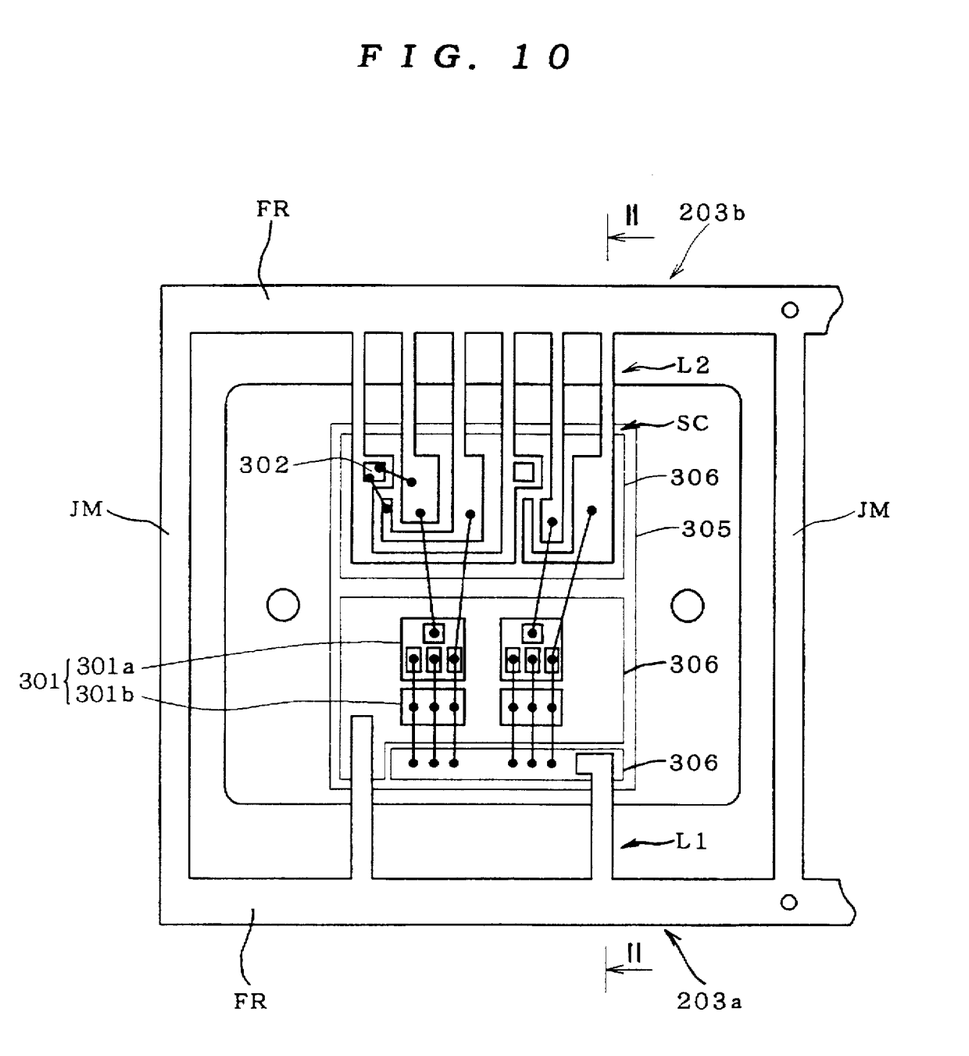
FIG. 10 is a plan view of the semiconductor device according to the fourth preferred embodiment of the present invention.

Referring to FIGS. 9 and 10, the construction of an IPM 4000 which is the semiconductor device according to a fourth preferred embodiment of the present invention will be described.

With reference to FIG. 9, the lead frame 203a is soldered to the circuit pattern layer 306 of the DBC substrate 305 in accordance with the circuit pattern of the circuit pattern layer 306. The power device 301 is directly bonded onto the lead frame 203a by soldering.

The insulative adhesive IA is applied to the upper surface of the circuit pattern layer 306 in accordance with the circuit pattern to bond the lead frame 203b to the circuit pattern layer 306. Like reference numerals and characters are used to designate elements identical with those of the IPM 3000 shown in FIG. 6, and the redundant description is dispensed with.

FIG. 10 is a plan view of the IPM 4000. FIG. 9 is a cross-sectional view taken in the direction of the arrows A—A of FIG. 10. For the purpose of simplification, the molding resin MR is not shown in FIG. 10.

As shown in FIG. 10, the lead frame 203a does not comprise the power device circuit pattern PC, and the lead group L1 extending from the frame FR is connected to the circuit pattern of the circuit pattern layer 306.

<D-2. Characteristic Function and Effect>

According to the fourth preferred embodiment of the present invention as described above, directly bonding the power device 301 onto the circuit pattern layer 306 permits the heat generated by the power device 301 during operation to be directly transferred to the circuit pattern layer 306, not through the lead frame 203a, achieving improvements in efficiency of heat dissipation over the IPM 3000 wherein the heat is transferred through the lead frame 203a.

The major surface of the power device 301 may be substantially levelled with the major surfaces of the lead frames 203a and 203b. This decreases the height of the aluminum interconnection wires extending from the power device 301 to the lead frames 203a and 203b to reduce the fabrication costs.

Further, the resin sealing by transfer molding involves injection of resin at a high pressure into the mold. Then, the increased height of the aluminum interconnection wires might cause resin to force the aluminum interconnection wires to fall down, resulting in contacts between the aluminum interconnection wires and between the adjacent lead and aluminum interconnection wire, producing rejects. The decreased height of the aluminum interconnection wires solves the problem and improves a fabrication yield.

<D-3. First Modification of Fourth Preferred Embodiment>

In the fourth preferred embodiment of the semiconductor device according to the present invention as above described, the lead frame 203b is bonded to the circuit pattern layer 306 by using the insulative adhesive IA. However, if there is no need to protect the control device 302 disposed on the lead frame 203b from electrical noises, solder may be used in place of the insulative adhesive IA to bond the lead frame 203b to the circuit pattern layer 306. In this modification, the solder layer SD must be shaped to conform to the circuit pattern configuration to prevent the electrical conduction between the individual circuit patterns through the solder.

<D-4. Second Modification of Fourth Preferred Embodiment>

In the fourth preferred embodiment according to the present invention, the DBC substrate 305 is placed on the heat sink 104 serving as the base therefor. However, the DBC substrate 305 may be used as the base without using the heat sink 104.

Figure 11:
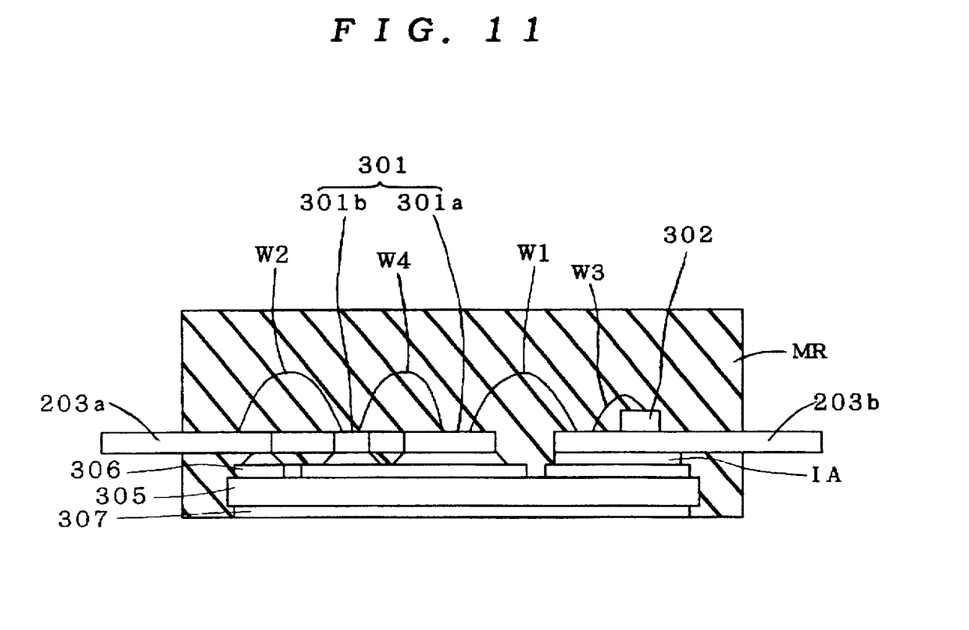
FIG. 11 is a cross-sectional view of a modification of the semiconductor device according to the fourth preferred embodiment of the present invention.

FIG. 11 illustrates a second modification of the fourth preferred embodiment. Referring to FIG. 11, the lower surface of the DBC substrate 305 (the surface of the DBC substrate 305 opposite from the lead frames) is not covered with the molding resin MR, but the electrically conductive layer 307 of the DBC substrate 305 is exposed.

Such an arrangement obviates the need for the heat sink 104 to reduce the fabrication costs. When the IPM is used, the electrically conductive layer 307 on the lower surface of the DBC substrate 305 is joined to an exterior heat sink not shown to dissipate heat.

While the invention has been described in detail, the foregoing description is in all aspects illustrative and not restrictive. It is understood that numerous other modifications and variations can be devised without departing from the scope of the invention.

We claim:

1. A semiconductor device comprising:

an insulating metal substrate;

a lead frame formed on said insulating metal substrate and having first and second circuit portions;

a power device formed on said first circuit portion of said lead frame; and a control device formed on said second circuit portion of said lead frame for controlling said power device, said insulating metal substrate including a heat sink for dissipating heat generated by said power device when said semiconductor device is in operation to the exterior, an insulating layer formed on an upper major surface of said heat sink, and a circuit pattern layer formed on said insulating layer and having first and second circuit patterns corresponding respectively to said first and second circuit portions, said first and second circuit portions of said lead frame being joined onto said first and second circuit patterns, respectively, said semiconductor device being sealed in resin by transfer molding so that a lower major surface of said heat sink is exposed.

2. The semiconductor device in accordance with claim 1, wherein said second circuit portion and said second circuit pattern are joined together by an insulative adhesive.

3. A semiconductor device comprising:

an-insulating base body;

a lead frame formed on said insulating base body and having first and second circuit portions;

a power device formed on said first circuit portion of said lead frame;

a control device formed on said second circuit portion of said lead frame for controlling said power device; and a heat sink joined to a lower major surface of said insulating base body for dissipating heat generated by said power device when said semiconductor device is in operation to the exterior, said insulating base body including a thermally conductive, electrically insulating substrate, a circuit pattern layer formed on said electrically insulating substrate and having first and second circuit patterns corresponding respectively to said first and second circuit portions, and an electrically conductive layer formed on a lower major surface of said electrically insulating substrate and joined to an upper major surface of said heat sink, said first and second circuit portions of said lead frame being joined onto said first and second circuit patterns, respectively, said semiconductor device being sealed in resin by transfer molding so that a lower major surface of said heat sink is exposed.

4. The semiconductor device in accordance with claim 3, wherein said second circuit portion and said second circuit pattern are joined. Together by an insulative adhesive.

5. A semiconductor device comprising:

an insulating base body;

a lead frame formed on said insulating base body and having first and second circuit portions;

a power device formed on said first circuit portion of said lead frame; and a control device formed on said second circuit portion of said lead frame for controlling said power device, said insulating base body including a thermally conductive, electrically insulating substrate, a circuit pattern layer formed on said electrically insulating substrate and having first and second circuit patterns corresponding respectively to said first and second circuit portions, and an electrically conductive layer formed on a lower major surface of said electrically insulating substrate, said first and second circuit portions of said lead frame being joined onto said first and second circuit patterns, respectively, said semiconductor device being sealed in resin by transfer molding so that a lower major surface of said electrically conductive layer is exposed.

6. The semiconductor device in accordance with claim 5, wherein said second circuit portion and said second circuit pattern are joined together by an insulative adhesive.

7. A semiconductor device comprising:

an insulating metal substrate;

a lead frame formed on said insulating metal substrate and having a predetermined circuit portion;

a power device formed on said insulating metal substrate; and a control device formed on said circuit portion of said lead frame for controlling said power device, said lead frame further including a lead connected to said power device, said insulating metal substrate including a heat sink for dissipating heat generated by said power device when said semiconductor device is operation to the exterior, an insulating layer formed on said heat sink, and a circuit pattern layer formed on said insulating layer and having a first circuit pattern directly joined to said power device and a second circuit pattern corresponding to said predetermined circuit portion of said lead frame, said predetermined circuit portion of said lead frame being joined onto said second circuit pattern, said lead being joined to said first circuit pattern, said semiconductor device being sealed in resin by transfer molding so that a lower major surface of said heat sink is exposed.

8. The semiconductor device in accordance with claim 7, wherein said circuit portion and said second circuit pattern are joined together by an insulative adhesive.

9. The semiconductor device in accordance with claim 7, wherein said power device is joined to said insulating base body so that an upper major surface of said power device is level with upper major surfaces of said lead and said circuit portion.

10. A semiconductor device comprising:

an insulating base body;

a lead frame formed on said insulating base body and having a predetermined circuit portion;

a power device formed on said insulating base body;

a control device formed on said circuit portion of said lead frame for controlling said power device; and a heat sink joined to a lower major surface of said insulating base body for dissipating heat generated by said power device when said semiconductor device is in operation to the exterior, said lead frame further including a lead connected to said power device, said insulating base body including
 a thermally conductive, electrically insulating substrate,
 a circuit pattern layer formed on said electrically insulating substrate and having a first circuit pattern directly joined to said power device and a second circuit pattern corresponding to said predetermined circuit portion of said lead frame, and
 an electrically conductive layer formed on a lower major surface of said electrically insulating substrate and joined to an upper major surface of said heat sink, said predetermined circuit portion of said lead frame being joined onto said second circuit pattern, said lead being joined to said first circuit pattern, said semiconductor device being sealed in resin by transfer molding so that a lower major surface of said heat sink is exposed.

11. The semiconductor device in accordance with claim 10, wherein said circuit portion and said second circuit pattern are joined together by an insulative adhesive.

12. The semiconductor device in accordance with claim 10, wherein said power device is joined to said insulating base body so that an upper major surface of said power device is level with upper major surfaces of said lead and said circuit portion.

13. A semiconductor device comprising:

an insulating base body;

a lead frame formed on said insulating base body and having a predetermined circuit portion;

a power device formed on said insulating base body; and a control device formed on said circuit portion of said lead frame for controlling said power device, said lead frame further including a lead connected to said power device, said insulating base body including
 a thermally conductive, electrically insulating substrate,
 a circuit pattern layer formed on said electrically insulating substrate and having a first circuit pattern directly joined to said power device and a second, circuit pattern corresponding to said predetermined circuit portion of said lead frame, and
 an electrically conductive layer formed on a lower major surface of said electrically insulating substrate, said predetermined circuit portion of said lead frame being joined onto said second circuit pattern, said lead being joined to said first circuit pattern, said semiconductor device being sealed in resin by transfer molding so that a lower major surface of said electrically conductive layer is exposed.

14. The semiconductor device in accordance with claim 13, wherein said circuit portion and said second circuit pattern are joined together by an insulative adhesive.

15. The semiconductor device in accordance with claim 14, wherein said insulative adhesive is a silicone-based adhesive.

16. The semiconductor device in accordance with claim 14, wherein said insulative adhesive is an epoxy-based adhesive.

17. The semiconductor device in accordance with claim 14, wherein said power device is joined to said insulating base body so that an upper major surface of said power device is level with upper major surfaces of said lead and said circuit portion.

* * * * *